United States Patent
Rajski et al.

(10) Patent No.: US 10,509,072 B2
(45) Date of Patent: Dec. 17, 2019

(54) TEST APPLICATION TIME REDUCTION USING CAPTURE-PER-CYCLE TEST POINTS

(71) Applicant: Mentor Graphics Corporation, Wilsonville, OR (US)

(72) Inventors: Janusz Rajski, West Linn, OR (US); Sylwester Milewski, Lubawskie (PL); Nilanjan Mukherjee, Wilsonville, OR (US); Jedrzej Solecki, Poznan (PL); Jerzy Tyszer, Poznan (PL); Justyna Zawada, Paczkowo (PL)

(73) Assignee: Mentor Graphics Corporation, Wilsonville, OR (US)

( * ) Notice: Subject to any disclaimer, the term of this patent is extended or adjusted under 35 U.S.C. 154(b) by 34 days.

(21) Appl. No.: 15/884,369

(22) Filed: Jan. 30, 2018

(65) Prior Publication Data

US 2018/0252768 A1 Sep. 6, 2018

Related U.S. Application Data

(60) Provisional application No. 62/467,023, filed on Mar. 3, 2017.

(51) Int. Cl.
*G01R 31/3177* (2006.01)
*G01R 31/317* (2006.01)
*G01R 31/3185* (2006.01)

(52) U.S. Cl.
CPC ... *G01R 31/3177* (2013.01); *G01R 31/31724* (2013.01); *G01R 31/31727* (2013.01); *G01R 31/318538* (2013.01); *G01R 31/318563* (2013.01); *G01R 31/318547* (2013.01)

(58) Field of Classification Search
CPC .................. G01R 31/3177; G01R 31/31724
See application file for complete search history.

(56) References Cited

U.S. PATENT DOCUMENTS

| 4,513,418 | A | 4/1985 | Bardell | |
|---|---|---|---|---|
| 6,327,685 | B1 * | 12/2001 | Koprowski | G01R 31/3181 365/201 |
| 6,389,566 | B1 * | 5/2002 | Wagner | G01R 31/318541 327/202 |
| 6,463,561 | B1 * | 10/2002 | Bhawmik | G01R 31/31707 714/726 |
| 6,636,997 | B1 * | 10/2003 | Wong | G01R 31/318536 714/728 |
| 6,684,358 | B1 * | 1/2004 | Rajski | G01R 31/31813 714/728 |
| 6,950,974 | B1 * | 9/2005 | Wohl | G01R 31/318547 714/728 |

(Continued)

OTHER PUBLICATIONS

G. Mrugalski, J. Rajski, J. Solecki, J. Tyszer, and C. Wang, "TestExpress—new time-effective scan-based deterministic test paradigm," Proc. ATS, 2015, pp. 19-24.
E. Moghaddam, N. Mukherjee, J. Rajski, J. Tyszer, and J. Zawada, "Test point insertion in hybrid test compression/LBIST architectures," Proc. ITC, 2016, paper 2.1.

(Continued)

*Primary Examiner* — Joseph D Torres

(57) ABSTRACT

Various aspects of the disclosed technology relate to using capture-per-cycle test points to reduce test application time. A scan-based testing system includes a plurality of regular scan chains and one or more capture-per-cycle scan chains on which scan cells capture and compact test responses at predetermined observation points per shift clock cycle.

14 Claims, 11 Drawing Sheets

(56) References Cited

U.S. PATENT DOCUMENTS

| | | | |
|---|---|---|---|
| 6,993,694 B1* | 1/2006 | Kapur | G01R 31/318547 324/527 |
| 7,925,947 B1* | 4/2011 | Touba | G01R 31/318547 714/726 |
| 9,335,377 B2 | 5/2016 | Rajski et al. | |
| 9,714,981 B2 | 7/2017 | Rajski et al. | |
| 2001/0052094 A1* | 12/2001 | Hamidi | G01R 31/318583 714/724 |
| 2002/0174393 A1* | 11/2002 | Udawatta | G01R 31/318536 714/726 |
| 2003/0056164 A1* | 3/2003 | Lauga | G01R 31/318536 714/726 |
| 2004/0230884 A1* | 11/2004 | Rajski | G01R 31/318566 714/742 |
| 2005/0028060 A1* | 2/2005 | Dervisoglu | G01R 31/318335 714/726 |
| 2006/0179393 A1* | 8/2006 | Harter | G01R 31/318566 714/758 |
| 2008/0072111 A1* | 3/2008 | Le | G01R 31/318502 714/726 |
| 2008/0195346 A1* | 8/2008 | Lin | G01R 31/318575 702/119 |
| 2008/0215943 A1* | 9/2008 | Guo | G01R 31/318544 714/729 |
| 2009/0235134 A1* | 9/2009 | Guo | G01R 31/318544 714/726 |
| 2014/0006889 A1* | 1/2014 | Motika | G01R 31/318547 714/732 |
| 2014/0164859 A1* | 6/2014 | Huang | G01R 31/318536 714/727 |
| 2015/0219717 A1* | 8/2015 | Ahrens | G01R 31/318547 714/727 |

OTHER PUBLICATIONS

F. Zhang, D. Hwong, Y. Sun, A. Garcia, S. Alhelaly, G. Shofner, L. Winemberg, and J. Dworak, "Putting wasted clock cycles to use: Enhancing fortuitous cell-aware fault detection with scan shift capture," Proc. ITC, 2016, paper 2.3.

B. Konemann, J. Mucha, and G. Zwiehoff, "Built-in logic block observation techniques," Proc. ITC, 1979, pp. 37-41.

A. Krasniewski and S. Pilarski, "Circular self-test path: a low cost BIST technique for VLSI circuits," IEEE Trans. CAD, vol. 8, No. 1, pp. 46-55, Jan. 1989.

A. Jas, K. Mohanram, and N.A. Touba, "An embedded core DFT scheme to obtain highly compressed test sets," Proc. ATS, 1999, pp. 275-280.

O. Novak and J. Nosek, "Test-per-clock testing of the circuits with scan," Proc. Int. On-Line Test. Workshop, 2001, pp. 90-92.

W. Rao and A. Orailoglu, "Virtual compression through test vector stitching for scan based designs," Proc. DATE, 2003, pp. 104-109.

H. Ando, "Testing VLSI with random access scan," Proc. COMPCON, 1980, pp. 50-52.

D. Baik and K. K. Saluja, "Progressive random access scan: a simultaneous solution to test power, test data volume and test time," Proc. ITC, 2005, pp. 359-368.

F. Como, P. Prinetto, and M. Sonza Reorda, "Making the circular self-test path technique effective for real circuits," Proc. ITC, 1994, pp. 949-957.

E. Kalligeros, X. Kavousianos, D. Bakalis, and D. Nikolos, "An efficient seeds selection method for LFSR-based test-per-clock BIST," Proc. ISQED, 2002, pp. 261-266.

Y. Son, J. Chong, and G. Russell, "E-BIST: Enhanced test-per-clock BIST architecture," IEEE Proc. Comput. Digit. Techn., vol. 149, pp. 9-15, Jan. 2002.

C. Stroud, "An automated BIST approach for general sequential logic synthesis," Proc. DAC, 1988, pp. 3-8.

* cited by examiner

TABLE I
DESIGN CHARACTERISTICS

| | Gates | Scan cells | Scan chains | Longest chain | TC [%] | Faults |
|---|---|---|---|---|---|---|
| D1 | 453K | 45K | 226 | 200 | 81.07 | 1.6M |
| D2 | 1.21M | 72K | 382 | 190 | 78.53 | 4.5M |
| D3 | 1.19M | 85K | 427 | 200 | 86.54 | 4.1M |
| D4 | 2.62M | 160K | 1,015 | 158 | 90.34 | 9.2M |
| D5 | 1.62M | 144K | 700 | 207 | 88.83 | 4.3M |
| D6 | 372K | 31K | 54 | 647 | 73.33 | 1.1M |

FIG. 7

TABLE II
EXPERIMENTAL RESULTS FOR STUCK-AT FAULTS

| | CPs | OPs | 1,000 patterns | | 2,000 patterns | | 4,000 patterns | | 10,000 patterns | |
|---|---|---|---|---|---|---|---|---|---|---|
| | | | TC [%] | ΔTC [%] | TC [%] | ΔTC [%] | TC [%] | ΔTC [%] | TC [%] | ΔTC [%] |
| D1 | 320 | 580 | 91.22 | 2.15 | 92.48 | 1.4 | 93.29 | 0.9 | 93.99 | 0.52 |
| D2 | 700 | 800 | 85.14 | 2.98 | 87.74 | 2.25 | 89.44 | 1.89 | 90.88 | 1.5 |
| D3 | 720 | 980 | 89.34 | 1.69 | 90.65 | 1.8 | 91.39 | 0.89 | 92.05 | 0.55 |
| D4 | 1,080 | 2,000 | 93.06 | 1.29 | 95.12 | 0.73 | 96.34 | 0.36 | 97.21 | 0.09 |
| D5 | 1,225 | 1,275 | 93.41 | 1.48 | 94.62 | 0.89 | 95.35 | 0.56 | 95.93 | 0.35 |
| D6 | 1,019 | 780 | 81.13 | 10.08 | 85.09 | 8.26 | 88.24 | 6.99 | 91.54 | 5.26 |

FIG. 8

TEST APPLICATION TIME REDUCTION USING CAPTURE-PER-CYCLE TEST POINTS

RELATED APPLICATIONS

This application claims the benefit of U.S. Provisional Patent Application No. 62/467,023, filed on Mar. 3, 2017, and naming Janusz Rajski et al. as inventors, which application is incorporated entirely herein by reference.

FIELD OF THE DISCLOSED TECHNOLOGY

The presently disclosed technology relates to the field of circuit testing. Various implementations of the disclosed technology may be particularly useful for reducing test application time.

BACKGROUND OF THE DISCLOSED TECHNOLOGY

Since its advent nearly five decades ago, scan has become one of the most influential and industry-proven structured design for test (DFT) technology. It allows a direct access to memory elements of a circuit under test (CUT) by reusing them to form shift registers in a test mode. The operative paradigm is then to employ automatic test equipment (ATE) or another source of test patterns to feed serial inputs of the scan chains, with the same ATE or a test response compactor capturing test responses that leave the scan chains through their serial outputs. As all scan cells are typically controlled by a single scan enable signal, scan chains remain functionally indistinguishable, i.e., they all either shift data in and out or capture test responses. The resultant high controllability and observability of internal nodes made it possible to automatically generate high quality tests and to debug the first silicon. Moreover, simple architecture of scan chains enables their automated stitching and insertion supported by electronic design automation (EDA) tools.

With the scan-based test paradigm firmly in place, several more advanced DFT technologies have been proposed. Noticeably, many logic built-in self-test (LBIST) schemes employ scan as their operational baseline to achieve high quality test while using a limited volume of test data. Usually, these solutions comprise a pseudorandom test pattern generator (PRPG) feeding scan chains and a multiple-input signature register (MISR) compacting shifted-out responses. The same rules apply to test data compression where PRPG is typically re-placed with an on-chip test data decompressor.

Drawbacks of scan-based testing are mainly related to the fact that all scan chains are filled with a test pattern before it is applied. As a result, the vast majority of test time is spent on just shifting test data. Consider a design with 100-cell long scan chains. Applying 10,000 double-capture test patterns will require 1,000,000 shift cycles and 20,000 capture cycles. Thus, as low as 2% of cycles are actually spent on testing. In terms of test time, this result would be visibly worse, as the scan shift frequency is usually much lower than that of a capture (functional) mode. In logic BIST, the test time efficiency could be even lower. With 100,000 single-capture test patterns, 10,000,000 cycles are needed for scan shifting, while only 100,000 cycles are deployed to capture test responses. Hence, 99.99% of test time is spent on scan shifting.

Electronics content in vehicles is constantly growing, which enables advanced safety features, new information and entertainment services, and greater energy efficiency. Integrated circuits for the automotive electronics market must adhere to stringent requirements for quality and reliability, which are largely driven by safety standards such as ISO 26262 and Automotive Safety Integrity Level (ASIL) targets. ISO 26262 compliance requires the adoption of more advanced test solutions. In particular, for an integrated circuit to achieve necessary levels of reliability, LBIST capabilities should respond to challenges posed by automotive parts and to support a number of in-field test requirements including an ability to run periodic tests during functional operations. These periodic tests should be performed in short time periods due to strict limits on the length of power-up or idle times. It is thus advantageous to develop test techniques that can shorten test application time without adversely impacting fault coverage.

BRIEF SUMMARY OF THE DISCLOSED TECHNOLOGY

Various aspects of the disclosed technology relate to using capture-per-cycle test points to reduce test application time. In one aspect, there is a system, comprising: scan chains for testing a circuit in a test mode, the scan chains comprising: a plurality of regular scan chains, the plurality of regular scan chains being scan chains configurable to shift in test stimuli, to capture test responses, and to shift out the captured test responses in the test mode, and one or more capture-per-cycle scan chains, the one or more capture-per-cycle scan chains being scan chains configurable to capture test responses at observation sites (observation points) selected for testing the circuit during scan shift operations in the test mode, each of the one or more capture-per-cycle scan chains comprising: scan cells, and signal-combining devices, each of the signal-combining devices being inserted between two neighboring scan cells in the scan cells, wherein an output of each of the signal-combining devices is connected to a data input of a first neighboring scan cell, a first input of the each of the signal-combining devices is connected to an output of a second neighboring scan cell, a second input of the each of the signal-combining devices is connected to one of the observation sites, and no outputs of the scan cells drive any logic of the circuit in the test mode.

The system may further comprise a storage medium storing the compressed test patterns and the control data. Alternatively, the system may further comprise a first storage medium storing the compressed test patterns; and a second storage medium storing the control data.

Each of the signal-combining devices may comprise an XOR logic gate. Each of the signal-combining devices may further comprise a logic gate, inputs of the logic gate being connected to the observation site and a test point enable signal (TPE) and an output of the logic gate being connected to an input of the XOR logic gate.

The each of the one or more capture-per-cycle scan chains may further comprise a clock-gating device, an output of the clock-gating device being connected to a clock input of each of the scan cells, a first input of the clock-gating device being connected to a clock signal and a second input of the clock-gating device being connected to a clock-gating signal controlling whether the scan cells receive a clock signal in the test mode or not.

The system may further comprise one or more control point scan chains configured to shift in and out test stimuli for control points in the test mode.

The test stimuli may be generated by a logic built-in self-test device in the test mode.

The system may further comprise a pseudo-random test pattern generator, of which outputs are connected to serial inputs of the scan chains; and a compactor, of which inputs are connected to serial outputs of the scan chains.

The system may further comprise a decompressor, of which outputs are connected to serial inputs of the scan chains; and a compactor, of which inputs are connected to serial outputs of the scan chains.

The observation site may be determined using a hybrid test point insertion method that can identify internal conflicts precluding efficient ATPG-based test compaction and detection of random resistant faults.

In another aspect, there are one or more non-transitory computer-readable media storing computer-executable instructions for causing a computer or networked computers to create the above system in a circuit design.

Certain inventive aspects are set out in the accompanying independent and dependent claims. Features from the dependent claims may be combined with features of the independent claims and with features of other dependent claims as appropriate and not merely as explicitly set out in the claims.

Certain objects and advantages of various inventive aspects have been described herein above. Of course, it is to be understood that not necessarily all such objects or advantages may be achieved in accordance with any particular embodiment of the disclose technology. Thus, for example, those skilled in the art will recognize that the disclose technology may be embodied or carried out in a manner that achieves or optimizes one advantage or group of advantages as taught herein without necessarily achieving other objects or advantages as may be taught or suggested herein.

BRIEF DESCRIPTION OF THE DRAWINGS

FIG. 7 illustrates a table showing characteristics of six designs D1-D6 used for experimental studies.

FIG. 8 illustrates a table showing the experimental results obtained for stuck-at faults for the six designs D1-D6.

DETAILED DESCRIPTION OF THE DISCLOSED TECHNOLOGY

General Considerations

Figure 1:
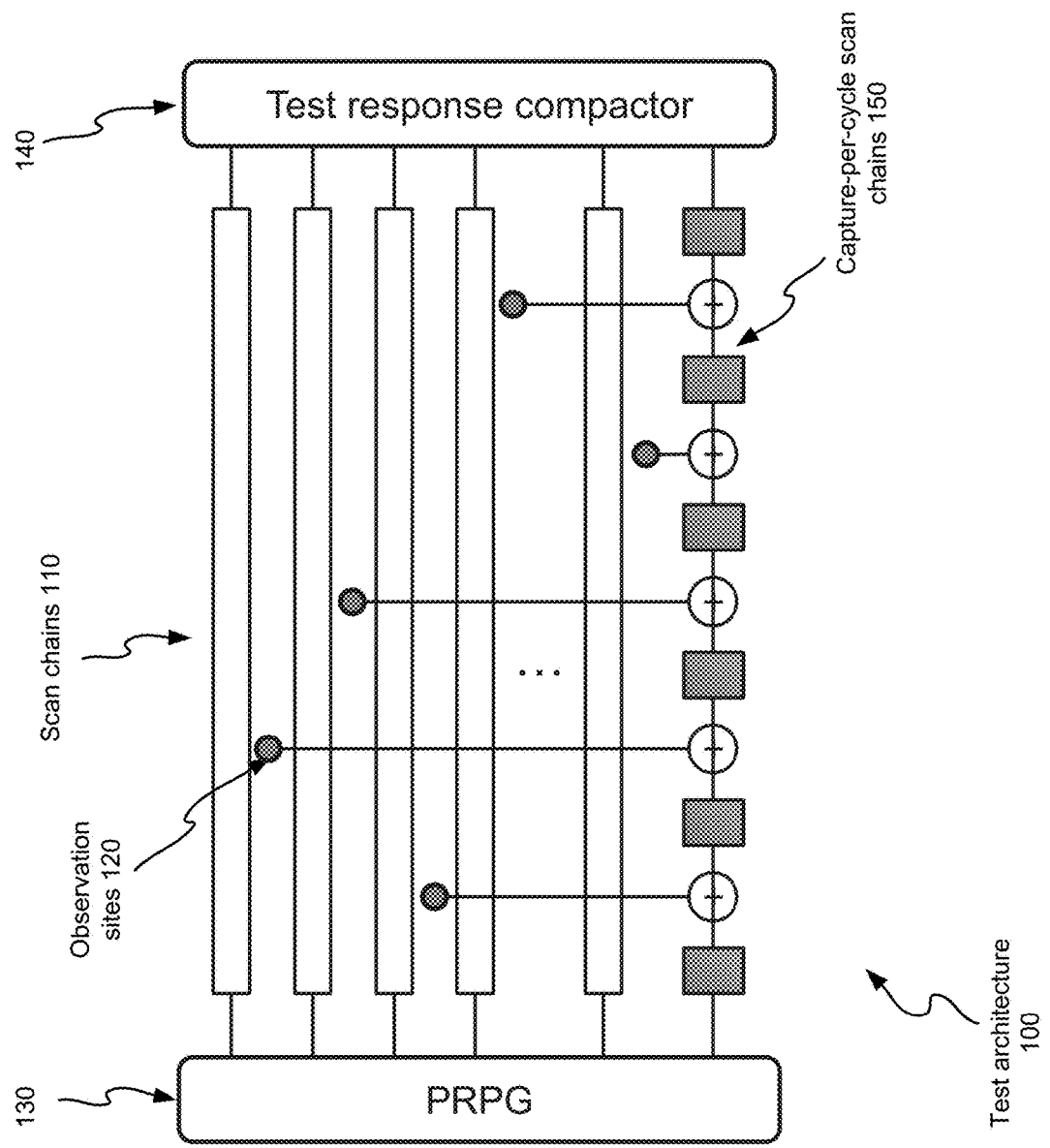
FIG. 1 an example of a test architecture 100 that may be implemented according to various embodiments of the disclosed technology.

Various aspects of the disclosed technology relate to using capture-per-cycle test points to reduce test application time. In the following description, numerous details are set forth for the purpose of explanation. However, one of ordinary skill in the art will realize that the disclosed technology may be practiced without the use of these specific details. In other instances, well-known features have not been described in detail to avoid obscuring the presently disclosed technology.

The detailed description of a method or a device sometimes uses terms like "connect" and "drive" to describe the disclosed method or the device function/structure. Such terms are high-level abstractions. The actual operations or functions/structures that correspond to these terms will vary depending on the particular implementation and are readily discernible by one of ordinary skill in the art. It should also be appreciated by one of ordinary skill in the art that the term "coupled" means "connected directly or indirectly."

Although the operations of the disclosed methods are described in a particular sequential order for convenient presentation, it should be understood that this manner of description encompasses rearrangements, unless a particular ordering is required by specific language set forth below. For example, operations described sequentially may in some cases be rearranged or performed concurrently. Moreover, for the sake of simplicity, the disclosed flow charts and block diagrams typically do not show the various ways in which particular methods can be used in conjunction with other methods.

Design For Test, Scan-Based Test, Test Compression, Logic BIST and Test Points

The reduction in feature size increases the probability that a manufacture defect in the integrated circuit will result in a faulty chip. A very small defect can result in a faulty transistor or interconnecting wire. Even a single faulty transistor or wire can cause the entire chip to function improperly. Manufacture defects are unavoidable nonetheless, no matter whether the manufacturing process is at the prototype stage or the high-volume manufacturing stage. It is thus necessary to test chips during the manufacturing process. Diagnosing faulty chips is also needed to ramp up and to maintain the manufacturing yield.

Testing typically includes applying a set of test stimuli (test patterns) to the circuit-under-test and then analyzing responses generated by the circuit-under-test. Functional testing attempts to validate that the circuit-under-test operates according to its functional specification while structural testing tries to ascertain that the circuit-under-test has been assembled correctly from some low-level building blocks as specified in a structural netlist and that these low-level building blocks and their wiring connections have been manufactured without defect. For structural testing, it is assumed that if functional verification has shown the correctness of the netlist and structural testing has confirmed the correct assembly of the structural circuit elements, then the circuit should function correctly. Structural testing has been widely adopted at least in part because it enables the test (test pattern) generation to focus on testing a limited number of relatively simple circuit elements rather than having to deal with an exponentially exploding multiplicity of functional states and state transitions.

To make it easier to develop and apply test patterns, certain testability features are added to circuit designs, which is referred to as design for test or design for testability (DFT). Scan testing is the most common DFT method. In a basic scan testing scheme, all or most of internal sequential state elements (latches, flip-flops, et al.) in a circuit design are made controllable and observable via a serial interface. These functional state elements are usually replaced with dual-purpose state elements called scan cells. Scan cells are connected together to form scan chains—serial shift registers for shifting in test patterns and shifting out test responses. A scan cell can operate as originally intended for functional purposes (functional/mission mode) and as a unit in a scan chain for scan (scan mode). A widely used type of scan cell include an edge-trigged flip-flop with two-way multiplexer for the data input. The two-way multiplexer is typically controlled by a single control signal called scan_enable, which selects the input signal for a scan cell from either a scan signal input port or a system signal input port. The scan signal input port is typically connected to an output of another scan cell while the system signal input port is connected to the functional logic. Scan cells can serve as both a control point and an observation point. Control points can be used to set certain logic values at some locations of the circuit-under-test, exciting a fault and propagating the incorrect value to an observation point. Scan testing allows the test equipment to access gates deeply embedded through the primary inputs/outputs and/or some physical test points and can remove the need for complicated state transition sequences when trying to control or observe what is happening at some internal circuit element.

Test patterns for scan testing are typically generated through an automatic test pattern generation (ATPG) process. ATPG usually focuses on a set of faults derived from a gate-level fault model. A defect is an imperfection caused in a device during the manufacturing process. A fault model is a description of how a defect alters design behavior. In another word, a defect is a flaw or physical imperfection that may lead to a fault. For a given target fault, ATPG comprises two phases: fault activation and fault propagation. Fault activation establishes a signal value at the fault site opposite that produced by the fault. Fault propagation propagates the fault effect forward by sensitizing a path from a fault site to a scan cell or a primary output. A fault at a site is said to be detected by a test pattern if a test response value captured by a scan cell or a primary output is different than the expected value. The objective of ATPG is to find a test pattern that, when applied to the circuit, enables testers to distinguish between the correct circuit behavior and the faulty circuit behavior caused by one or more particular faults. Effectiveness of ATPG is measured by the fault coverage achieved for the fault model and the number of generated vectors (test pattern counts), which should be directly proportional to test application time. Here, the fault coverage is defined as a ratio of the number of detected faults vs. the total number of faults.

The most popular fault model used in practice is the single stuck-at fault model. In this model, one of the signal lines in a circuit is assumed to be stuck at a fixed logic value, regardless of what inputs are supplied to the circuit. The stuck-at fault model is a logical fault model because no delay information is associated with the fault definition. Delay faults cause errors in the functioning of a circuit based on its timing. They are caused by the finite rise and fall time periods of the signals in the gates, as well as, the propagation delay of interconnects between the gates. Transition faults are used for their simplicity in modeling spot defects that affect delays at inputs or outputs of gates. Under scan-based tests, the transition faults are associated with an extra delay that is large enough to cause the delay of any path through the fault site to exceed the clock period.

During the circuit design and manufacturing process, a manufacturing test screens out chips (dies) containing defects. The test itself, however, does not identify the reason for the unacceptable low or fluctuating yield that may be observed. Physical failure analysis (PFA) can inspect the faulty chip to locate the defect location(s) and to discover the root cause. The process usually includes etching away certain layers and then imaging the silicon surface by scanning electronic microscopy or focused ion beam systems. This PFA process is laborious and time consuming. To facilitate the PFA process, diagnosis is often employed to narrow down possible locations of the defect(s) based on analyzing the fail log (fail file, failure file). The fail log typically contains information about when (e.g., tester cycle), where (e.g., at what tester channel), and how (e.g., at what logic value) the test failed and which test patterns generate expected test responses. The layout information of the circuit design may also be employed to further reduce the number of defect suspects.

Test application in chip manufacturing test is normally performed by automatic test equipment (ATE) (a type of testers). Scan-based tests consume significant amounts of storage and test time on ATE. The data volume increases with the number of logic gates on the chip and the same holds for the number of scan cells. Yet, practical considerations and ATE specifications often limit both the number of pins available for scan in/out and the maximum scan frequency. It is highly desirable to reduce the amount of test data that need to be loaded onto ATE and ultimately to the circuit under test. Fortunately, test patterns are compressible mainly because only 1% to 5% of test pattern bits are typically specified bits (care bits) while the rest are unspecified bits (don't-care bits). Unspecified bits can take on any values with no impact on the fault coverage. Test compression may also take advantage of the fact that test cubes tend to be highly correlated. A test cube is a deterministic test pattern in which the don't-care bits are not filled by ATPG. The correlation exists because faults are structurally related in the circuit.

Various test compression techniques have been developed. In general, additional on-chip hardware before and after scan chains is inserted. The hardware (decompressor) added before scan chains is configured to decompress test stimulus coming from ATE, while the hardware (compactor) added after scan chains is configured to compact test responses captured by the scan chains. The decompressor expands the data from n tester channels to fill greater than n scan chains. The increase in the number of scan chains shortens each scan chain and thus reduces the number of clock cycles needed to shift in each test pattern. Thus, test compression can reduce not only the amount of data stored on the tester but also the test time for a given test data bandwidth.

The embedded deterministic test (EDT) is one example of test compression techniques. The EDT-based compression is composed of two complementary parts: hardware that is embedded on chip, and deterministic ATPG software that generates compressed patterns that utilize the embedded hardware. The EDT hardware features a continuous-flow decompressor. The EDT compression of test cubes is performed by treating the external test data as Boolean variables. Scan cells are conceptually filled with symbolic expressions that are linear functions of input variables injected into the decompressor. In the case of a decompressor comprising a ring generator and an associated phase shifter, a set of linear equations corresponding to scan cells whose values are specified may be used. A compressed pattern can be determined by solving the system of equations. If the compressed pattern determined as such is then scanned in through the decompressor, the bits that were specified by ATPG will be generated accordingly. Unspecified bits are set to pseudorandom values based on the decompressor architecture. Additional details concerning EDT-based compression and decompression are found in J. Rajski, J. Tyszer, M. Kassab, and N. Mukherjee, "Embedded deterministic test," IEEE Trans. CAD, vol. 23, pp. 776-792, May 2004, and U.S. Pat. Nos. 6,327,687; 6,353,842; 6,539,409; 6,543,020; 6,557,129; 6,684,358; 6,708,192; 6,829,740; 6,874,109; 7,093,175; 7,111,209; 7,260,591; 7,263,641; 7,478,296; 7,493,540; 7,500,163; 7,506,232; 7,509,546; 7,523,372; 7,653,851, of which all are hereby incorporated herein by reference.

Logic built-in self-test (Logic BIST) is a DFT technique that permits a circuit to test itself using embedded test logic without the need of an external tester. Classical Logic BIST applications include detecting infant mortality defects during burn-in test, enabling the use of low-cost and/or low-speed testers that only provide power and clock signals, and in-system self-testing to improve the reliability of the system in aerospace/defense, automotive, telecommunications and healthcare industries. A typical logic BIST system includes a test pattern generator for automatically generating test patterns, a test response analyzer (compactor) for compacting test responses into a signature and a logic BIST controller for coordinating the BIST operation and for providing a pass/fail indication. A pseudo-pattern pattern generator (PRPG), a commonly used test pattern generator, can be constructed from a linear feedback shift register (LFSR) or a cellular automaton. To increase the fault coverage, a weighted LFSR may be employed. Another approach is to combine random test patterns with deterministic patterns in some fashion as the BIST logic can be used to handle compressed test patterns that are generated deterministically and stored on chip.

Test points can also be used to increase the fault coverage for logic BIST by improving the probability of detecting random-resistant faults. Test point insertion (TPI) algorithms select hard-to-control and hard-to-observe sites to insert control and observation points. When active, a control point forces a circuit's node to a specific logic value, whereas an observation point acts as a pseudo-primary output. To identify the most effective test points while minimizing their total number and a possible impact on a design performance, numerous approximate techniques have been proposed. These TPI algorithms may be guided by exact fault simulation, approximate testability measures, cost functions, gradient-based metrics, or signal correlation.

Test points can be used to decrease deterministic pattern counts as well. For example, a test point insertion algorithm can aim at identifying and resolving conflicts between ATPG-assigned internal signals through insertion of conflict-aware test points to increase the number of faults detected by a single pattern. A hybrid test point insertion method is recently developed to simultaneously reduce deterministic test pattern counts and increase detectability of random-resistant faults by resolving cases where demands of internal nets for a given logic value come up against very low likelihood of getting this value with pseudorandom tests. Details concerning the hybrid test point insertion method can be found in E. Moghaddam et al., "Test point insertion in hybrid test compression/LBIST architectures," 2016 IEEE International Test Conference (ITC), paper 2.1.

All of the above mentioned processes, design insertion for testing, test pattern generation, test compression, and test point insertion, are normally performed by various electronic design automation tools such as those in the Tessent family of software tools available from Mentor Graphics Corporation, Wilsonville, Oreg.

Test Architecture

FIG. 1 illustrates an example of a test architecture 100 that may be implemented according to various embodiments of the disclosed technology. The test architecture 100 comprises scan chains 110. The scan chains 110 comprise a plurality of regular scan chains for shifting in test stimuli and capturing and shifting out test responses generated by the circuit under test (illustrated by long bars) and a capture-per-cycle scan chain 150 comprising scan cells (green rectangles) and signal-combining devices (circles). The output for each of the signal-combining devices is connected to the data input of the neighboring scan cell downstream while the two inputs for each of the signal-combining devices are connected to the output of the neighboring scan cell upstream and one of observation sites (observation points) 120, respectively. Unlike a scan cell on a regular scan chain, the output for each of the scan cells on the capture-per-cycle scan chain 150 does not drive any logic of the circuit under test in the test mode. It should be noted that while only one capture-per-cycle scan chain is shown in the figure, the test architecture according to various embodiments of the disclosed technology can have multiple capture-per-cycle scan chains.

The test architecture 100 also comprises a pseudo-random pattern generator (PRPG) 130 and a test response compactor 140. As noted previously, the pseudo-random pattern generator may be a linear feedback shift register (LFSR) or a cellular automaton (CA), and the test response compactor may be implemented by a multiple-input signature register (MISR). It should be noted that a test architecture according to various embodiments of the disclosed technology can use another test stimuli source such as a decompressor for deterministic testing or a hybrid device to replace the pseudo-random pattern generator 130. It should also be noted that an on-chip test stimuli source is not required to practice the disclosed technology.

Figure 2:
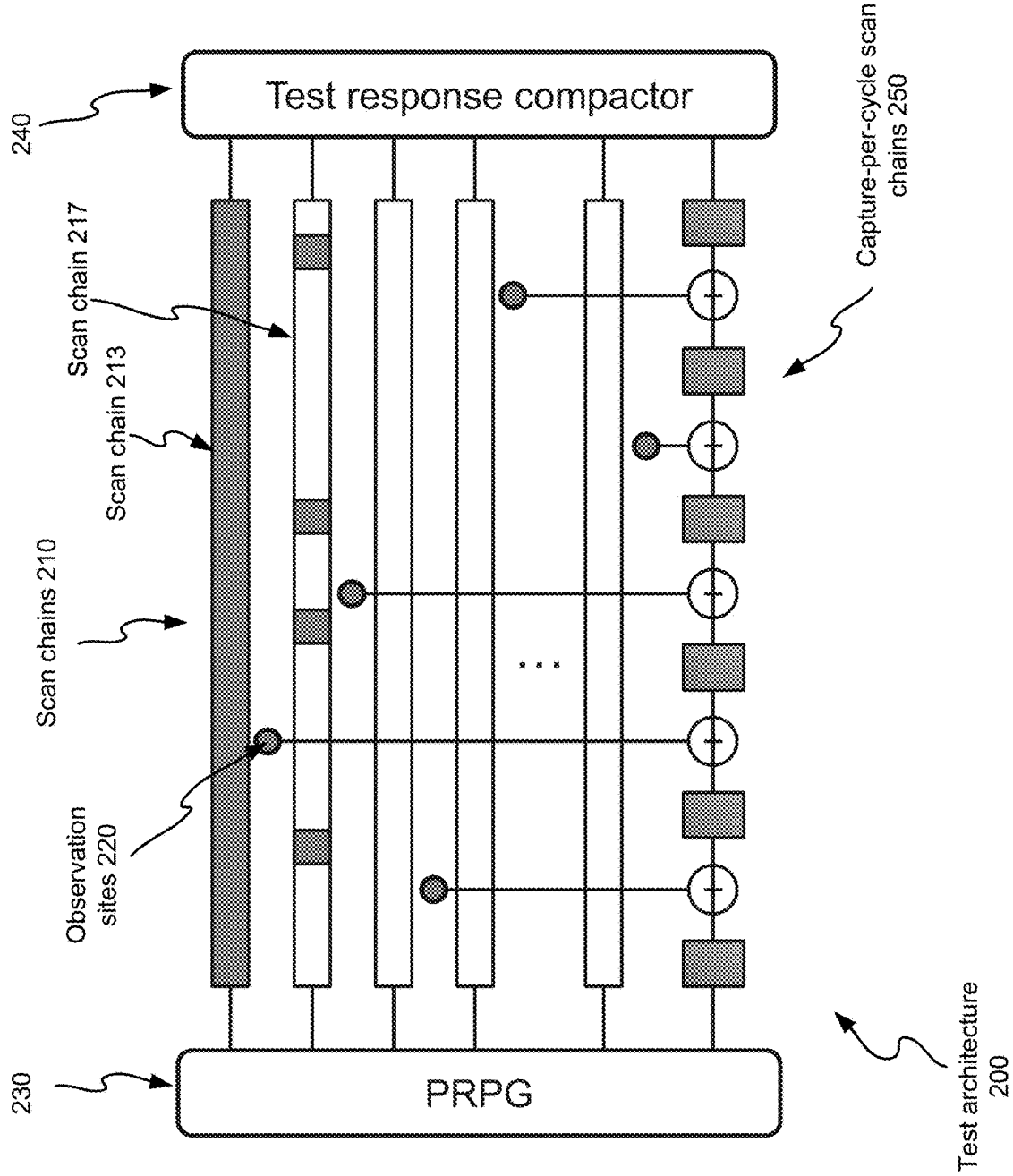
FIG. 2 illustrates an example of a test architecture 200 containing control point scan chains that may be implemented according to various embodiments of the disclosed technology.

The scan chains 110 may further comprise scan chains on which some or all of the scan cells operate in the shift mode during a test to host drivers of control points. FIG. 2 illustrates an example of a test architecture 200 containing such scan chains that may be implemented according to various embodiments of the disclosed technology. Like the test architecture 100 shown in FIG. 1, the test architecture 200 comprises scan chains 210, a pseudo-random pattern generator (PRPG) 230 and a test response compactor 240. Like the scan chains 110, the scan chains 210 comprise a plurality of regular scan chains and a capture-per-cycle scan chain 250. However, the scan chains further comprise scan chains 213 and 217 which contain scan cells for driving control points only (indicated in red color). As seen in the figure, the scan chain 213 is a scan chain hosting exclusively derivers of control points (referred to as control point scan chain) while the scan chain 217 has scan cells for driving control points interspersed among other regular scan cells. These scan cells for driving control points on the scan chains 213 and 217 do not perform capture operations during a test.

Figure 3:
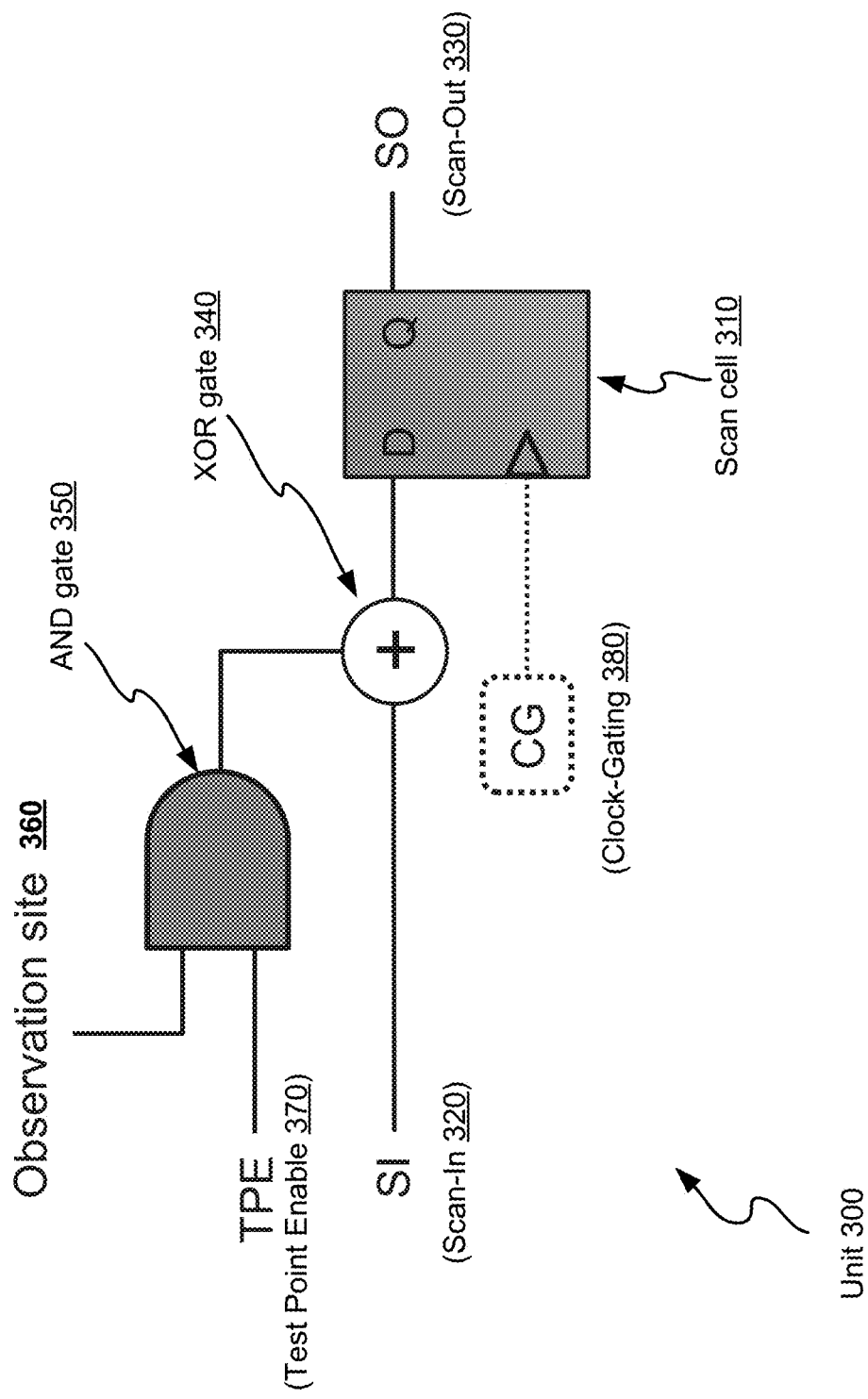
FIG. 3 illustrates an example of one unit on the capture-per-cycle scan chain that may be implemented according to various embodiments of the disclosed technology.

FIG. 3 illustrates an example of a unit 300 of the capture-per-cycle scan chain that may be implemented according to various embodiments of the disclosed technology. The unit 300 comprises a scan cell 310, an AND gate 350 and an XOR gate 340. The AND gate 350 and the XOR gate 340 form a signal-combining device (indicated as a circle in FIGS. 1 and 2). A global test point enable (TPE) signal 370 is employed to activate observation points in the test mode, and to disable them in the mission mode (functional mode). The test response received from an observation site is XOR-ed with data provided by the scan cell upstream via scan-in 320, thus incorporating shift and capture functionality within a single clock cycle. The data provided through scan-in 320 is a test response captured by the scan cell upstream during the previous clock cycle. Because of it, the capture-per-cycle scan chain is sometimes said to operate in a compaction mode during a test. Optionally, a clock gating (CG) circuitry 380 may be used to control whether scan chains operating in the compaction mode are actually active after asserting the corresponding enable (CGEN) signal.

The following is an example of the test architecture such as the test architecture 100 or the test architecture 200 operating during a test according to various embodiments of the disclosed technology: Initially, the first pseudorandom test pattern is shifted in, and both the regular scan chains and the capture-per-cycle scan chains capture a test response. Next, when the response is shifted-out with the subsequent test pattern filling gradually both the regular scan chains and the control point scan chains, the content of these scan cells becomes stimuli feeding the circuit every clock cycle. It allows the capture-per-cycle scan chains to capture and to accumulate test responses every clock cycle, as well. Furthermore, a single bit of the resultant response enters a test response compactor (e.g., a MISR) in a per-cycle regime. As a result, the circuit is tested in accordance with the test-per-clock paradigm, while preserving benefits of the conventional test-per-shift approach. Although compaction of test responses is the primary operation mode of the capture-per-cycle scan chains, their cells can be modified in order to run scan chain integrity test and to help in silicon debug and diagnosis.

Test Point Sites

Suitable test point locations may be determined by searching for internal lines that have low observability, but are preferable propagation paths for a significant number of faults. Moreover, control points may be selected by also considering whether they can improve fault propagation towards test-per-clock-driven observation points, and thus increase their detection probability. The conventional stuck-at-0 and stuck-at-1 faults are used here as an example to explain the relevant technology.

The number of faults propagating through a net can be an important factor for introducing new observation points, and to demonstrate how they work synergistically with the corresponding control points. To model how many faults can potentially reach every single line in a circuit, weighted testability measures may be employed. In particular, the weighted testability measures quantify a given stem's impact on lines it drives and lines it is driven by in terms of controllability and observability. As several stems may affect a single line x, the testability responsiveness to changes occurring at those stems should also be computed. The resultant controllability and observability of line x are eventually chosen as maxima over metrics obtained for all stems affecting x. It is worth noting that the weighted metrics are more accurate than conventional COP-based analysis in handling re-convergent fan-outs and in estimating fault detection likelihood which is described in detail in F. Brglez et al., "Applications of testability analysis: from ATPG to critical delay path tracing," Proc. ITC, 1984, pp. 705-712.

Figure 4:
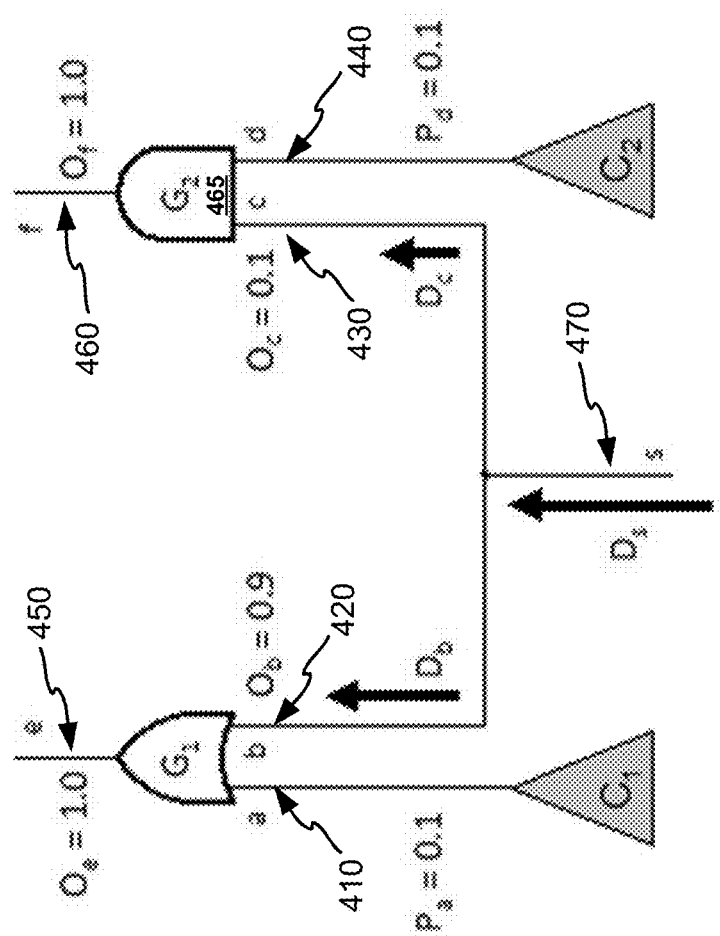
FIG. 4 illustrates a circuit used as an example to explain how to determine a weighted metric and sites for observation points.

Having determined testability measures, a circuit can be processed in a gate-level order. Starting from the first level, the number of faults occurring at the output of each gate is computed as a sum of faults reaching its inputs. If a stem with fan-out branches is encountered, faults are distributed to its branches proportionally to their observabilities. FIG. 4 illustrates a circuit that will be used as an example to explain how to determine a weighted metric. Let $P_a$ and $P_d$ be 1-controllabilites that reflect difficulty of setting lines a (410) and d (440) to 1, respectively. Let $P_a=P_d=0.1$. Lines e (450) and f (460), as primary outputs, are fully observable, i.e., $O_e=O_f=1.0$. The observabilities of branches b (420) and c (430) are $O_b=O_e \cdot (1-P_a)=0.9$ and $O_c=O_f \cdot P_d=0.1$. Note that the line observability is the probability of sensitizing a fault propagation path from that particular line to any output. The size of arrow $D_s$ represents faults propagating through stem s (470). Clearly, line b (420) has much better observability than line c (430), thus the number of faults propagating through branch b (420) is greater than faults reaching input c (430) of gate $G_2$ (465), accordingly. In general, the number of faults propagating from stem s (470) through branch x is determined as follows:

$$D_x = \alpha \cdot D_s \quad (1)$$

where $\alpha$ is a distribution factor computed as a ratio of line x observability and the sum of all branches observabilities.

In many circuits, there are faults, which are difficult to detect by means of pseudorandom patterns due to severe propagation conditions. In those cases, observation points can be added to shorten propagation paths. The disclosed technology can, however, enrich the observation points' functionality due to the ability to capture as many faults as possible every shift clock cycle.

Note that conventional testability measures usually grant all outputs (and pseudo-outputs, e.g., regular scan cells) full observability all the time. However, in the test point analysis according to various embodiments of the disclosed technology, the observability measures can be appropriately adjusted to represent the fact that observation points capture faulty effects into dedicated flip-flops every shift cycle, whereas regular scan cells collect test responses only during a single (or multiple) capture cycles that occur at the end of the entire scan shift-in phase. Hence, observability metrics can be modified so that every single observation point x gets $O_x=1.0$ during all shift and capture cycles, while observabilities for the remaining scan cells are set to 1/n, where n is the size of the longest scan chain.

To identify low observability internal lines propagating, at the same time, prominent number of faults, observation performance $\Omega x$ for line x may be computed as follows:

$$\Omega_x = -D_x \cdot \log_{10} O_x \quad (2)$$

where $D_x$ is the number of faults propagating through net x, and $O_x$ represents line x observability. Since $O_x \leq 1$, the larger the value of $D_x$, the more attractive observation point line x can make. For example, if $D_x=1000$ and $O_x=10^{-4}$, then $\Omega_x=4000$. However, if the number of faults is relatively small, say $D_x=10$, the observation performance drops to $\Omega_x=40$. The former case clearly indicates that an observation point at x is highly desired and is expected to facilitate detection of a significant number of faults. It is also worth noting that observabilities of regular scan cells (recall that all of them are set to 1/n) discourage the test point insertion (TPI) procedure from assuming that conventional scan chains may suffice as effective observation points. Instead, TPI tries to identify bottlenecks in a design, where fault propagation is systematically hampered and can be cured by adding observation points of the new class.

Since a new observation point may affect observabilities of other nets, and thus it may change fault propagation paths, the remaining testability metrics need to be updated. Hence, once an observation point is inserted, the observabilities of other nets as well as quantities of faults propagating through lines within a circuit area affected by the observation point may be updated as follows: 1) Starting from the location of the newly inserted observation point, move backward towards inputs and update observability of each traversed line marking all visited stems, until no changes can be made; 2) given all visited stems, pick the lowest-level stem s; and 3) beginning with stem s and by using Eq. (1), move forward towards outputs in a gate-level order updating fault propagation data until no further changes can be made.

Figure 5:
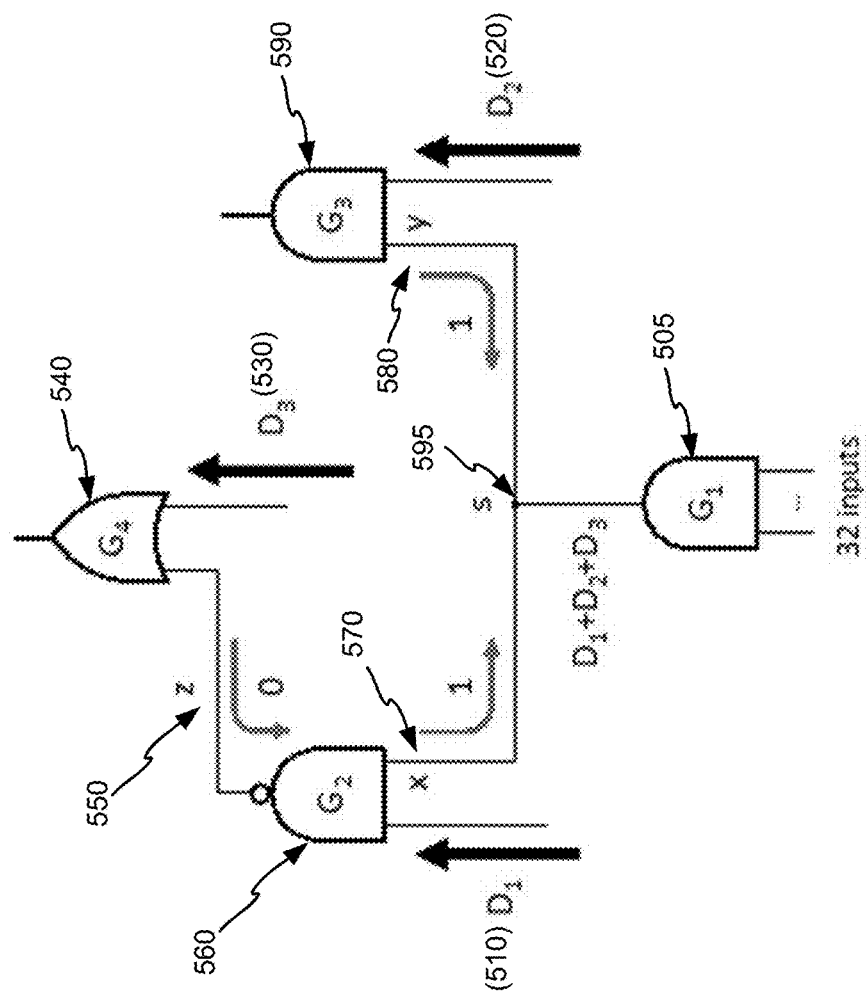
FIG. 5 illustrates a circuit used as an example to explain how to determine sites for control points.

Control points can be primarily used to facilitate fault propagation towards scan chains operating in the compaction mode—the capture-per-cycle scan chains. FIG. 5 illustrates a circuit that will be used as an example to explain how to determine sites for control points. Let the black arrows denote faults propagating through the lines the arrows are placed next to, and let $D_1$ (510), $D_2$ (520), and $D_3$ (530) represent their quantities—further referred to as faults $D_i$. To propagate faults $D_3$ (530) through OR gate $G_4$ (540), input z (550) must be set to 0 at least $D_3$ times. The logic value of 0 at the output of gate $G_2$ (560) implies, inter alia, x=1, and since it is a non-controlling value for the NAND gate, faults $D_1$ (510) reaching gate $G_2$ (560) can propagate towards scan cells or primary outputs. Clearly, to propagate faults $D_1$ (510) and $D_3$ (530), x (570) must be set to 1 at least $D_1+D_3$ times. Furthermore, to enable propagation of faults $D_2$ through gate $G_3$ (590), one needs to set y (580) to 1 for each fault of $D_2$ (520). As a result, in order to propagate faults $D_1$ (510), $D_2$ (520), and $D_3$ (530), stem s (595) must be set to 1 at least $D_1+D_2+D_3$ times. Note that the same analysis may be done in a contrapositive fashion. Indeed, if one applies 0 at the output of gate $G_1$ (505), then propagation of faults $D_1$ (510) and $D_3$ (530) is blocked (they cannot be observed at the output of gates $G_2$ (560) and $G_4$ (540), respectively). Moreover, faults $D_2$ (520) are also blocked since 0 is a controlling value for gate $G_3$ (590). Clearly, having 0 at stem s (595) precludes propagation of $D_1+D_2+D_3$ faults, and thus, stem s (595) needs to be set to 1 $D_1+D_2+D_3$ times to ensure fault propagation.

As can be seen in FIG. 5, stem s (595) must be set to 1 in a relatively large number of cases. However, getting 1 at the output of $G_1$ (505) is very unlikely (1 out of $2^{32}$) random event. Fortunately, an OR-type control point can be placed on the output of $G_1$ (505) to resolve this conflict. As a result, chances of propagating faults $D_1$, $D_2$, and $D_3$ forward are significantly increased. A comprehensive analysis of such hybrid conflicts and methods to resolve them through insertion of hybrid control points can be found in E. Moghaddam et al., "Test point insertion in hybrid test compression/LBIST architectures," 2016 IEEE International Test Conference (ITC), paper 2.1.

To insert successive hybrid test points, a circuit can be processed in a gate-level order in two major steps according to some embodiments of the disclosed technology. First, testability measures and other metrics are computed for each net and prepare two lists of the most suitable locations for control and observation points, respectively. To begin with, controllabilites and observabilities for each line are determined, as shown in E. Moghaddam et al., "Test point insertion in hybrid test compression/LBIST architectures," 2016 IEEE International Test Conference (ITC), paper 2.1.

Next, starting from the primary inputs, faults are propagated forward, and subsequently performance of a candidate observation point is determined for each net in accordance with Eq. (2). The last iteration of the first step computes requirements for 0 s and 1 s for each internal line by traversing the entire circuit in a reversed gate-level order. At the same time, the hybrid conflicts for control points are computed. As a result, the first part of this procedure yields two sorted lists (in a descending order) representing the best locations for control and observation points.

Typically, the number of test points and its breakdown into control and observation points is a design-dependent factor. Thus, to guide test point insertion, the resultant test coverage may be monitored, as new control and observation points continue to be added into a design. Let $T_x$ be fault x detection probability defined as follows:

$$T_{x/0} = P_x \cdot O_x \quad (3)$$

$$T_{x/1} = (1-P_x) \cdot O_x \quad (4)$$

where x/0 and x/1 are line x stuck-at-0 and stuck-at-1 faults. The values of $P_x$ and $(1-P_x)$ represent a degree of difficulty in setting line x to 1 and 0, respectively. Consequently, test coverage for T test patterns can be estimated as the average over the entire list of testable faults by using the probabilities of detecting successive faults by at least one out of T test patterns.

In the second phase of this TPI process, the top of the control point list is repeatedly removed, the corresponding CP is inserted into a design, and its impact on test coverage is determined. Next, the newly inserted control point is withdrawn, previous state of a circuit is restored and exactly the same actions is performed as before, but now insertion of an observation point is considered from the current top of observation point list. The decision which test point should be actually added into a design is made based on the resultant test coverage improvements achieved in each case. The rejected test point returns to its list. Note that after inserting every control point, all testability measures and other metrics should be updated, accordingly. In the case of observation points, this process is executed as described previously. The TPI procedure iterates until the number of inserted test points matches the desired and user-defined number of test points that can be added into the design.

Illustrative Computing Environment

Figure 6:
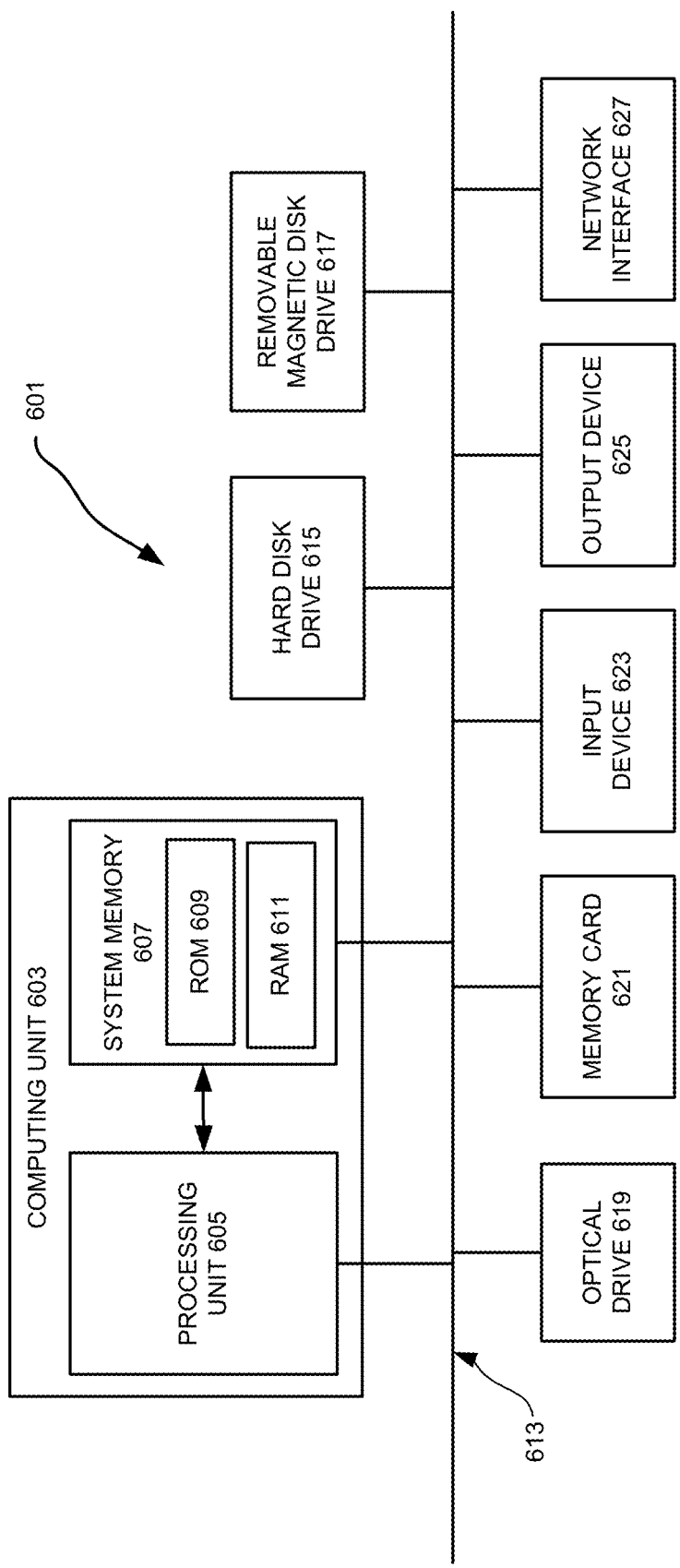
FIG. 6 illustrates a programmable computer system with which various embodiments of the disclosed technology may be employed.

Some embodiments of the disclosed technology related to inserting test circuitry into a design may be implemented through the execution of software instructions by a computing device, such as a programmable computer. FIG. 6 shows an illustrative example of such a programmable computer (a computing device 601). As seen in this figure, the computing device 601 includes a computing unit 603 with a processing unit 605 and a system memory 607. The processing unit 605 may be any type of programmable electronic device for executing software instructions, but will conventionally be a microprocessor. The system memory 607 may include both a read-only memory (ROM) 609 and a random access memory (RAM) 611. As will be appreciated by those of ordinary skill in the art, both the read-only memory (ROM) 609 and the random access memory (RAM) 611 may store software instructions for execution by the processing unit 605.

The processing unit 605 and the system memory 607 are connected, either directly or indirectly, through a bus 613 or alternate communication structure, to one or more peripheral devices. For example, the processing unit 605 or the system memory 607 may be directly or indirectly connected to one or more additional memory storage devices, such as a "hard" magnetic disk drive 615, a removable magnetic disk drive 617, an optical disk drive 619, or a flash memory card 621. The processing unit 605 and the system memory 607 also may be directly or indirectly connected to one or more input devices 623 and one or more output devices 625. The input devices 623 may include, for example, a keyboard, a pointing device (such as a mouse, touchpad, stylus, trackball, or joystick), a scanner, a camera, and a microphone. The output devices 625 may include, for example, a monitor display, a printer and speakers. With various examples of the computer 601, one or more of the peripheral devices 615-625 may be internally housed with the computing unit 603. Alternately, one or more of the peripheral devices 615-625 may be external to the housing for the computing unit 603 and connected to the bus 613 through, for example, a Universal Serial Bus (USB) connection.

With some implementations, the computing unit 603 may be directly or indirectly connected to one or more network interfaces 627 for communicating with other devices making up a network. The network interface 627 translates data and control signals from the computing unit 603 into network messages according to one or more communication protocols, such as the transmission control protocol (TCP) and the Internet protocol (IP). Also, the interface 627 may employ any suitable connection agent (or combination of agents) for connecting to a network, including, for example, a wireless transceiver, a modem, or an Ethernet connection. Such network interfaces and protocols are well known in the art, and thus will not be discussed here in more detail.

It should be appreciated that the computer 601 is illustrated as an example only, and it not intended to be limiting. Various embodiments of the disclosed technology may be implemented using one or more computing devices that include the components of the computer 601 illustrated in FIG. 6, which include only a subset of the components illustrated in FIG. 6, or which include an alternate combination of components, including components that are not shown in FIG. 6. For example, various embodiments of the disclosed technology may be implemented using a multi-processor computer, a plurality of single and/or multiprocessor computers arranged into a network, or some combination of both.

Experimental Results

Based on some embodiments of the disclosed technology, experiments were performed on five industrial designs that are currently in a high-volume production and one circuit from the ITC'99 test suite. Relevant information about the designs, including the number of gates, the number of scan cells, the size of the longest scan chain, a baseline (no test points) test coverage after applying 10 K pseudorandom test patterns, and the number of testable faults is reported in Table I shown in FIG. 7. To evaluate the performance of the proposed fast LBIST scheme, its test coverage is compared with test coverage provided by a conventional LBIST.

In preparations for the experiments, two groups of hybrid test points for each design were generated. These test points were inserted by employing the algorithm described above. The first group of test points is designated for designs implementing the conventional BIST environment, further referred to as a reference case, where all regular scan cells and additional observation points are fully observable once a test pattern is entirely shifted into internal scan chains, and a circuit becomes ready to capture a test response. 10 K pseudorandom test patterns are applied in this case.

The second group of test points is used, for each design, in conjunction with the new BIST framework. Recall that these test points not only increase the detection probability of random-resistant faults but also, more importantly, enable detection of faults during scan-shift cycles. As a result, observation points allow one to capture faulty effects every shift cycle, while control points facilitate fault propagation towards additional scan chains operating in the compaction mode (observation point cells). This is accomplished by assigning all regular scan cells the observability value of 1/n (where n is the size of the longest scan chain), whereas the remaining observation sites have the observability set to 1.0. As in the previous case, the target pattern count comprises 10 K base pseudorandom patterns. However, additional (intermediate) test patterns are also taken into account. Let $T_i$ and $T_{i+1}$ be two subsequent base test patterns. Their intermediate patterns consist of capture values corresponding to $T_i$ and PRPG-produced values that correspond to $T_{i+1}$. Clearly, the first intermediate vector of a given bundle is always equal to a test response obtained for $T_i$, while the remaining ones are gradually generated on the fly as a result of scanning-out a test response of $T_i$ and scanning-in a new pattern $T_{i+1}$ at the same time. This process repeats until a predetermined number of R pseudorandom base test patterns are generated. As can be easily verified, the total number P of patterns applied to the CUT by the new LBIST scheme is given by $$P = R + (R-1) \cdot n \quad (5)$$

where $(R-1) \cdot n$ is the number of intermediate test patterns applied when the regular scan chains are shifting, and n, as earlier, is the size of the longest scan chain.

Table II shown in FIG. 8 lists the experimental results obtained for stuck-at faults. The first two columns report the breakdown of test points (control points—CPs and observation points—OPs) obtained by deploying the algorithm of Section 5. Recall that the very same number of control and observation points is used for every reference test case. The actual number of test points is 2% of the entire scan cell population. The next columns of Table II give test coverage TC obtained in the reference case, and then test coverage increase ΔTC is reported for the new LBIST scheme after applying 1 K, 2 K, 4 K, and 10 K base pseudorandom patterns. It is worth observing that given, for example, 2 K base pseudorandom patterns, the new method is using 2000+ 1999 n test vectors (see formula 5). For scan of a moderate size, say n=100, the total number of actually applied patterns amounts then to almost 202 K.

Figure 9:
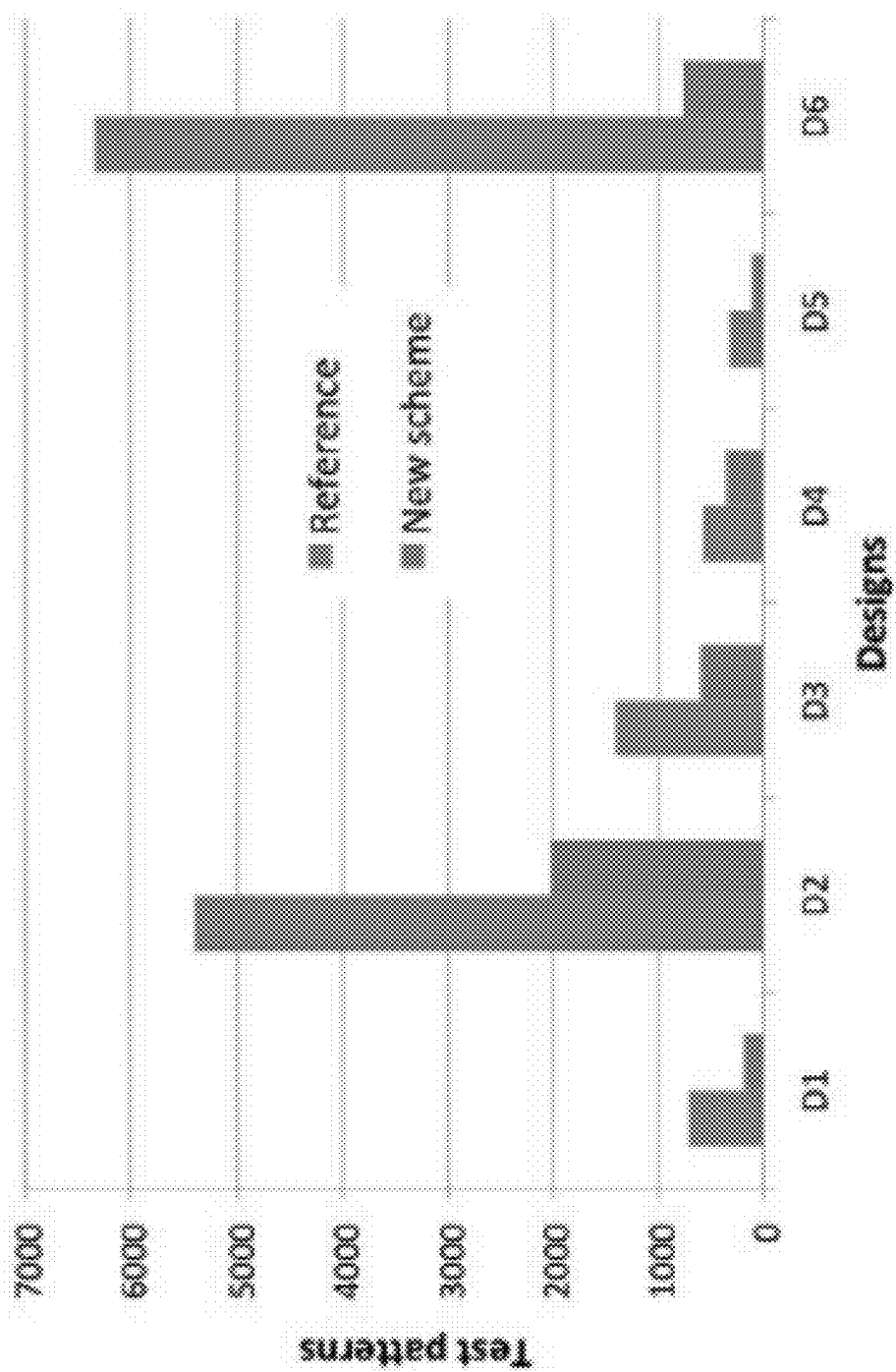
FIG. 9 illustrates how many test patterns it takes for both the conventional LBIST and an embodiment of the disclosed technology to reach target 90% test coverage.

FIG. 9 demonstrates how many test patterns it takes for both the conventional LBIST with test points and an embodiment of the disclosed technology to reach target 90% test coverage—an industry-wide accepted automotive electronics in-field-test-quality standard. As can be seen, superiority of the new solution is clearly pronounced. In the case of the industrial designs, the new LBIST outperforms the traditional approach, on the average, by a factor of 2.7. In other words, the new LBIST is capable of providing 90% test coverage more than 2.5 times faster than its state-of-the-art conventional counterpart. With the transition to fully computerized vehicles speeding-up and breaking into the mainstream automobile market, the above result is definitely worth noting.

Figure 10:
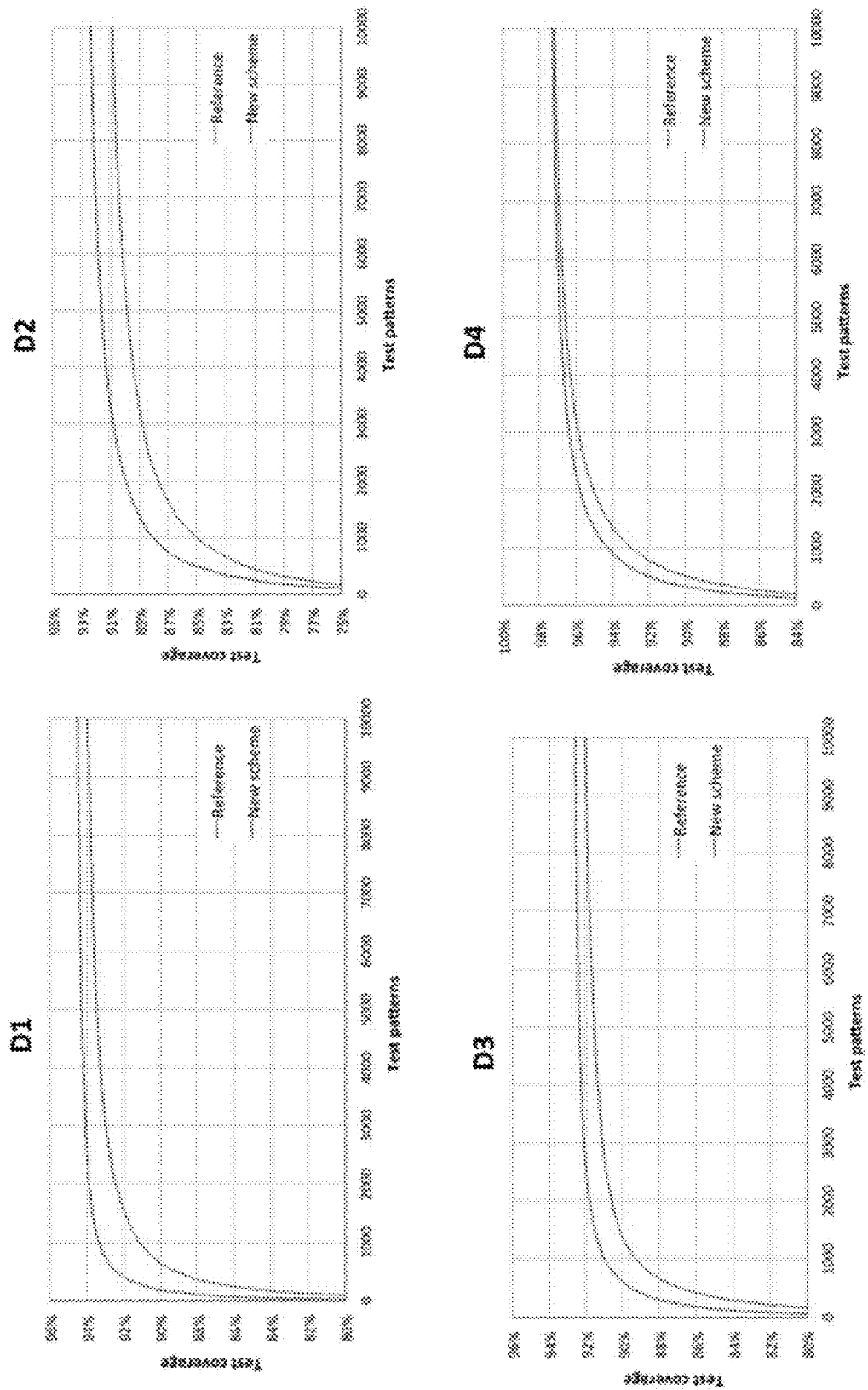
FIG. 10 illustrates curves of test coverage as a function of test application time for designs D1-D4.
Figure 11:
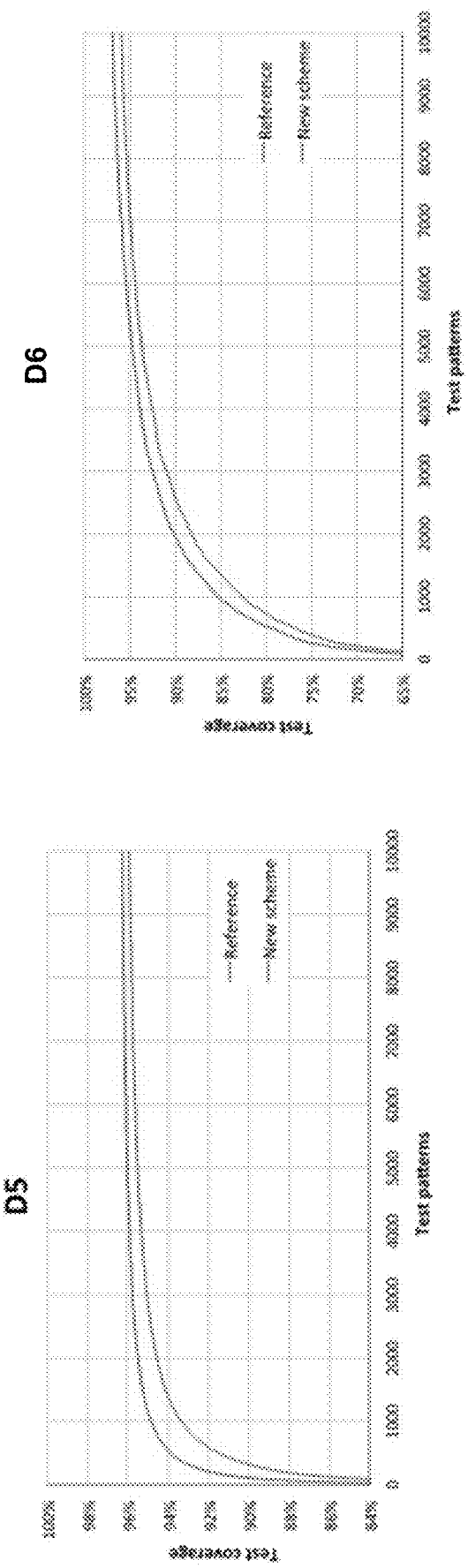
FIG. 11 illustrates curves of test coverage as a function of test application time for designs D5-D6.

The charts shown in FIGS. 10-11 provide a much more comprehensive illustration of test coverage as a function of test application time. As can be seen, in all examined test cases, the proposed method (the red curve) reaches a given test coverage level in much shorter test time than the conventional LBIST (the blue curve) does. Furthermore, in the case of designs D1, D2, and D3, test coverage provided by the new scheme remains noticeably higher (after 10 K base pseudorandom patterns) than that of the reference case.

One final note regarding the above experiments is needed here. Whenever a fault propagates to scan chains operating in the compaction mode, it is temporarily marked as detected. Clearly, a fault may not make it to the scan serial outputs in an unlikely event of aliasing. In such a case, a fault remains a target. The probability of fault masking is extremely small as these scan chains form finite memory devices, where after several clock cycles (depending on a fault injection site) an error is shifted out. This observation is fully supported by both deferred fault crediting that indicates only highly incidental cases of such events, and the fault simulation experiments reported in this section run in the no fault dropping mode with a compaction scan chains emulator.

As the experimental results show, the disclose technology can significantly reduce test application time (or to apply much larger number of vectors within the same time interval) by having pseudorandom test patterns delivered in a test-per-clock fashion through conventional scan chains and by recording test results by means of per-cycle-driven observation test points. In particular, orders of magnitude more test patterns (depending on the scan size) can be applied during the time of a conventional scan-based logic BIST session. The disclosed technology is well positioned to achieve a better coverage of un-modeled defects. With various implementations of the disclosed technology, observation test points can be used to monitor the most sensitive fault propagation paths.

The disclosed technology may help in improving quality of fault diagnosis, as the compaction scan chains are not allowed to propagate the erroneous responses back to the circuit. Thus, the existing partial-scan-based diagnostic techniques turn out to be applicable. Moreover, an observation scan cell puts an XOR gate on the scan path in the dedicated chains. Hence, patterns can be shifted intact allowing one to run chain diagnostic tests in a conventional manner.

Conclusion

While the disclosed technology has been described with respect to specific examples including presently preferred modes of carrying out the disclosed technology, those skilled in the art will appreciate that there are numerous variations and permutations of the above described systems and technology that fall within the spirit and scope of the disclosed technology as set forth in the appended claims. For example, while the embedded deterministic test has been employed to describe the disclosed technology, it should be appreciated that various examples of the disclosed technology may be implemented using any desired test compression schemes.

What is claimed is:

1. A system, comprising:
    scan chains for testing a circuit in a test mode, the scan chains comprising:
        a plurality of regular scan chains, the plurality of regular scan chains being scan chains configurable to shift in test stimuli, to capture test responses, and to shift out the captured test responses in the test mode, and
        one or more capture-per-cycle scan chains, the one or more capture-per-cycle scan chains being scan chains configurable to capture test responses at observation sites (observation points) selected for testing the circuit during scan shift operations in the test mode, each of the one or more capture-per-cycle scan chains comprising:
            scan cells, and
            signal-combining devices, each of the signal-combining devices being inserted between two neighboring scan cells in the scan cells, wherein:
                each of the signal-combining devices comprises an XOR logic gate and a logic gate,
                inputs of the logic gate are respectively connected to one of the observation sites and to a test point enable signal (TPE),
                an output of the logic gate is connected to an input of the XOR logic gate,
                an output of each of the signal-combining devices is connected to a data input of a first neighboring scan cell,
                a first input of the each of the signal-combining devices is connected to an output of a second neighboring scan cell, and
                no outputs of the scan cells drive any logic of the circuit in the test mode.

2. The system recited in claim 1, wherein the each of the one or more capture-per-cycle scan chains further comprises:
    a clock-gating device, an output of the clock-gating device being connected to a clock input of each of the scan cells, a first input of the clock-gating device being connected to a clock signal and a second input of the clock-gating device being connected to a clock-gating signal controlling whether the scan cells receive a clock signal in the test mode or not.

3. The system recited in claim 1, further comprising:
    one or more control point scan chains configured to shift in and out test stimuli for control points in the test mode.

4. The system recited in claim 1, wherein the test stimuli are generated by a logic built-in self-test device in the test mode.

5. The system recited in claim 1, further comprising:
    a pseudo-random test pattern generator, of which outputs are connected to serial inputs of the scan chains; and
    a compactor, of which inputs are connected to serial outputs of the scan chains.

6. The system recited in claim 1, further comprising:
    a decompressor, of which outputs are connected to serial inputs of the scan chains; and
    a compactor, of which inputs are connected to serial outputs of the scan chains.

7. The system recited in claim 1, wherein the observation site is determined using a hybrid test point insertion method that can identify internal conflicts precluding efficient ATPG-based test compaction and detection of random resistant faults.

8. One or more computer-readable media storing computer-executable instructions for causing a computer to create a system in a circuit design, the system comprising:
    scan chains for testing a circuit in a test mode, the scan chains comprising:
        a plurality of regular scan chains, the plurality of regular scan chains being scan chains configurable to shift in test stimuli, to capture test responses, and to shift out the captured test responses in the test mode, and
        one or more capture-per-cycle scan chains, the one or more capture-per-cycle scan chains being scan chains configurable to capture test responses at observation sites (observation points) selected for testing the circuit during scan shift operations in the test mode, each of the one or more capture-per-cycle scan chains comprising:

scan cells, and signal-combining devices, each of the signal-combining devices being inserted between two neighboring scan cells in the scan cells, wherein:

each of the signal-combining devices comprises an XOR logic gate and a logic gate, inputs of the logic gate are respectively connected to one of the observation sites and to a test point enable signal (TPE), an output of the logic gate is connected to an input of the XOR logic gate, an output of each of the signal-combining devices is connected to a data input of a first neighboring scan cell, a first input of the each of the signal-combining devices is connected to an output of a second neighboring scan cell, and no outputs of the scan cells drive any logic of the circuit in the test mode.

9. The one or more computer-readable media recited in claim 8, wherein the each of the one or more capture-per-cycle scan chains further comprises:

a clock-gating device, an output of the clock-gating device being connected to a clock input of each of the scan cells, a first input of the clock-gating device being connected to a clock signal and a second input of the clock-gating device being connected to a clock-gating signal controlling whether the scan cells receive a clock signal in the test mode or not.

10. The one or more computer-readable media recited in claim 8, wherein the system further comprises:

one or more control point scan chains configured to shift in and out test stimuli for control points in the test mode.

11. The one or more computer-readable media recited in claim 8, wherein the test stimuli are generated by a logic built-in self-test device in the test mode.

12. The one or more computer-readable media recited in claim 8, wherein the system further comprises:

a pseudo-random test pattern generator, of which outputs are connected to serial inputs of the scan chains; and a compactor, of which inputs are connected to serial outputs of the scan chains.

13. The one or more computer-readable media recited in claim 8, wherein the system further comprises:

a decompressor, of which outputs are connected to serial inputs of the scan chains; and a compactor, of which inputs are connected to serial outputs of the scan chains.

14. The one or more computer-readable media recited in claim 8, wherein the observation site is determined using a hybrid test point insertion method that can identify internal conflicts precluding efficient ATPG-based test compaction and detection of random resistant faults.

* * * * *